United States Patent
Ishida

(10) Patent No.: US 12,317,425 B2
(45) Date of Patent: May 27, 2025

(54) METHOD FOR MANUFACTURING PRINTED WIRING BOARD AND PRINTED WIRING BOARD

(71) Applicant: IBIDEN CO., LTD., Gifu (JP)

(72) Inventor: Atsushi Ishida, Ogaki (JP)

(73) Assignee: IBIDEN CO., LTD., Ogaki (JP)

( * ) Notice: Subject to any disclaimer, the term of this patent is extended or adjusted under 35 U.S.C. 154(b) by 258 days.

(21) Appl. No.: 18/188,654

(22) Filed: Mar. 23, 2023

(65) Prior Publication Data
US 2023/0309244 A1   Sep. 28, 2023

(30) Foreign Application Priority Data

Mar. 25, 2022  (JP) .................................. 2022-049608

(51) Int. Cl.
*H05K 3/38* (2006.01)
*H05K 1/02* (2006.01)
*H05K 1/09* (2006.01)
*H05K 1/11* (2006.01)
*H05K 3/16* (2006.01)
*H05K 3/18* (2006.01)
*H05K 3/40* (2006.01)

(52) U.S. Cl.
CPC ......... *H05K 3/4038* (2013.01); *H05K 1/0298* (2013.01); *H05K 1/09* (2013.01); *H05K 1/115* (2013.01); *H05K 3/16* (2013.01); *H05K 3/188* (2013.01); *H05K 2203/095* (2013.01)

(58) Field of Classification Search
CPC ............. H05K 3/386; H05K 2203/095; H05K 3/4038; H05K 1/0298; H05K 1/115
See application file for complete search history.

(56) References Cited

U.S. PATENT DOCUMENTS

| | | | | |
|---|---|---|---|---|
| 2009/0092749 A1* | 4/2009 | Tachibana | ............ | H05K 3/4644 427/98.8 |
| 2009/0133910 A1* | 5/2009 | Ohashi | ................. | H05K 3/0032 205/160 |
| 2010/0065194 A1* | 3/2010 | Nagase | .................. | H05K 3/427 156/230 |

(Continued)

FOREIGN PATENT DOCUMENTS

JP        2015-054987 A        3/2015

*Primary Examiner* — Sherman Ng
(74) *Attorney, Agent, or Firm* — Oblon, McClelland, Maier & Neustadt, L.L.P.

(57) ABSTRACT

A method for manufacturing a printed wiring board includes forming a first conductor layer, forming an adhesive layer including a nitrogen-based organic compound and covering a surface of the first layer, forming a resin insulating layer covering the adhesive layer and having the second surface facing the first conductor layer, forming a protective film on the first surface of the insulating layer, forming an opening in the insulating layer such that the opening penetrates through the insulating layer and reaches the adhesive layer, applying plasma to the opening of the insulating layer such that the plasma cleans an inside of the opening, removing the protective film from the insulating layer after cleaning the inside of the opening, forming a second conductor layer on the first surface of the insulating layer, and forming a via conductor in the opening such that the via conductor connects the first layer and second layer.

20 Claims, 4 Drawing Sheets

(56) References Cited

U.S. PATENT DOCUMENTS

2015/0027754 A1* 1/2015 Shimoda ............ C08G 73/1053
                                                524/588
2016/0381805 A1* 12/2016 Miyoshi ................ B32B 15/20
                                                156/247
2017/0042025 A1* 2/2017 Miyamoto ............. B32B 15/08
2020/0365534 A1* 11/2020 Darmawikarta .... H01L 23/5283

* cited by examiner

METHOD FOR MANUFACTURING PRINTED WIRING BOARD AND PRINTED WIRING BOARD

CROSS-REFERENCE TO RELATED APPLICATIONS

The present application is based upon and claims the benefit of priority to Japanese Patent Application No. 2022-049608, filed Mar. 25, 2022, the entire contents of which are incorporated herein by reference.

BACKGROUND OF THE INVENTION

Field of the Invention

The present invention relates to a method for manufacturing a printed wiring board and a printed wiring board.

Description of Background Art

Japanese Patent Application Laid-Open Publication No. 2015-54987 describes a printed wiring board in which a chemical conversion film is formed on a surface of copper forming a circuit. The entire contents of this publication are incorporated herein by reference.

SUMMARY OF THE INVENTION

According to one aspect of the present invention, a method for manufacturing a printed wiring board includes forming a first conductor layer including a conductor circuit, forming, on the first conductor layer, an adhesive layer including a nitrogen-based organic compound such that the adhesive layer covers a surface of the first conductor layer, forming, on the first conductor layer, a resin insulating layer such that the resin insulating layer covers the adhesive layer and has a second surface facing the first conductor layer on the opposite side with respect to a first surface, forming a protective film on the first surface of the resin insulating layer, forming an opening for a via conductor in the resin insulating layer such that the opening penetrates through the resin insulating layer and reaches the adhesive layer, applying plasma to the opening of the resin insulating layer such that the plasma cleans an inside of the opening of the resin insulating layer, removing the protective film from the resin insulating layer after cleaning the inside of the opening of the resin insulating layer, forming a second conductor layer on the first surface of the resin insulating layer, and forming a via conductor in the opening of the resin insulating layer such that the via conductor connects the first conductor layer and the second conductor layer.

According to another aspect of the present invention, a printed wiring board includes a first conductor layer, a resin insulating layer formed on the first conductor layer, a second conductor layer formed on a surface of the resin insulating layer, a via conductor formed in an opening formed in the resin insulating layer such that the via conductor is connecting the first conductor layer and the second conductor layer, and an adhesive layer including a nitrogen-based organic compound and formed between the resin insulating layer and a surface of the first conductor layer other than a portion exposed from the opening.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DETAILED DESCRIPTION OF THE EMBODIMENTS

Figure 1:
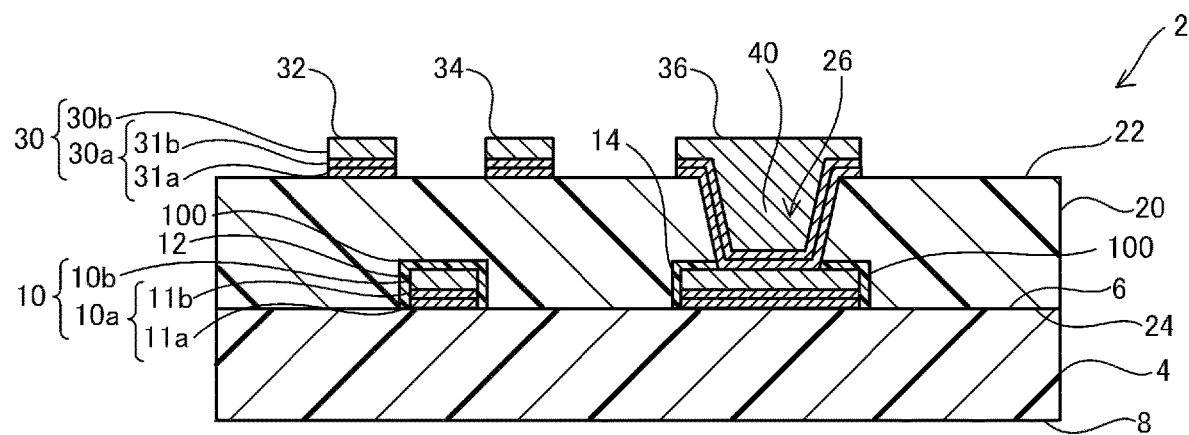
FIG. 1 is a cross-sectional view schematically illustrating a printed wiring board according to an embodiment of the present invention.

Embodiments will now be described with reference to the accompanying drawings, wherein like reference numerals designate corresponding or identical elements throughout the various drawings.

Embodiment

FIG. 1 is a cross-sectional view illustrating a printed wiring board 2 according to an embodiment of the present invention. As illustrated in FIG. 1, the printed wiring board 2 includes an insulating layer 4, a first conductor layer 10, a resin insulating layer 20, a second conductor layer 30, and a via conductor 40.

The insulating layer 4 is formed using a thermosetting resin. The insulating layer 4 may be formed of a photocurable resin. The insulating layer 4 may contain inorganic particles such as silica particles. The insulating layer 4 may contain a reinforcing material such as a glass cloth. The insulating layer 4 has a third surface 6 (upper surface in the drawing) and a fourth surface 8 (lower surface in the drawing) on the opposite side with respect to the third surface 6.

The first conductor layer 10 is formed on the third surface 6 of the insulating layer 4. The first conductor layer 10 includes a signal wiring 12 and a pad 14. Although not illustrated in the drawing, the first conductor layer 10 also includes conductor circuits other than the signal wiring 12 and the pad 14. The first conductor layer 10 is mainly formed of copper. The first conductor layer 10 is formed of a seed layer (10a) on the insulating layer 4 and an electrolytic plating film (10b) on the seed layer (10a). The seed layer (10a) is formed by a first layer (11a) on the third surface 6 and a second layer (11b) on the first layer (11a). The first layer (11a) is formed of a copper alloy containing copper, silicon and aluminum. The second layer (11b) is formed of copper. The electrolytic plating film (10b) is formed of copper. The first layer (11a) is in contact with the insulating layer 4.

A surface of the first conductor layer 10 is formed of a first surface and a second surface. The first surface is exposed from an opening 26 and is not covered by an adhesive layer 100. The second surface is a portion other than the first surface and is covered by the adhesive layer 100. The adhesive layer 100 is formed of a nitrogen-based organic compound. The nitrogen-based organic compound forming the adhesive layer 100 is, for example, a tetrazole compound. The nitrogen-based organic compound may be a tetrazole compound disclosed in Japanese Patent Application Laid-Open Publication No. 2015-54987. The adhesive layer 100 covers the second surface of the first conductor layer 10, but does not cover the third surface 6 exposed from the first conductor layer 10.

The resin insulating layer 20 is formed on the first conductor layer 10 via the adhesive layer 100. The resin insulating layer 20 has a first surface 22 (upper surface in the drawing) and a second surface 24 (lower surface in the drawing) on the opposite side with respect to the first surface 22. The second surface 24 of the resin insulating layer 20 faces the first conductor layer 10. The resin insulating layer 20 has an opening 26 that expose the pad 14. The resin insulating layer 20 is formed of an epoxy resin and inorganic particles dispersed in the epoxy resin. Examples of the resin include a thermosetting resin and a photocurable resin. Examples of the inorganic particles include silica particles and alumina particles.

No unevenness is formed on the first surface 22 of the resin insulating layer 20. The first surface 22 is not roughened. The first surface 22 is formed smooth. On the other hand, an inner wall surface of the opening 26 has unevenness. A thickness of the resin insulating layer 20 is two or more times a thickness of the second conductor layer 30. The thickness of the resin insulating layer 20 is a distance between the first surface 22 and the upper surface of the first conductor layer 10.

The second conductor layer 30 is formed on the first surface 22 of the resin insulating layer 20. The second conductor layer 30 includes a first signal wiring 32, a second signal wiring 34, and a land 36. Although not illustrated in the drawing, the second conductor layer 30 also includes conductor circuits other than the first signal wiring 32, the second signal wiring 34, and the land 36. The first signal wiring 32 and the second signal wiring 34 form a pair wiring. The second conductor layer 30 is mainly formed of copper. The second conductor layer 30 is formed by a seed layer (30a) on the first surface 22 and an electrolytic plating film (30b) on the seed layer (30a). The seed layer (30a) is formed by a first layer (31a) on the first surface 22 and a second layer (31b) on the first layer (31a). The first layer (31a) is formed of a copper alloy containing copper, silicon and aluminum. The second layer (31b) is formed of copper. The electrolytic plating film (30b) is formed of copper. The first layer (31a) is in contact with the first surface 22.

The forming of the seed layer includes: forming a first layer by sputtering; and forming a second layer on the first layer by sputtering using a material different from that of the first layer.

The via conductor 40 is formed in the opening 26. The via conductor 40 connects the first conductor layer 10 and the second conductor layer 30. In FIG. 1, the via conductor connects the pad 14 and the land 36. The via conductor 40 is formed of a seed layer (40a) and an electrolytic plating film (40b) on the seed layer (40a).

Method for Manufacturing Printed Wiring Board

Figure 2A:
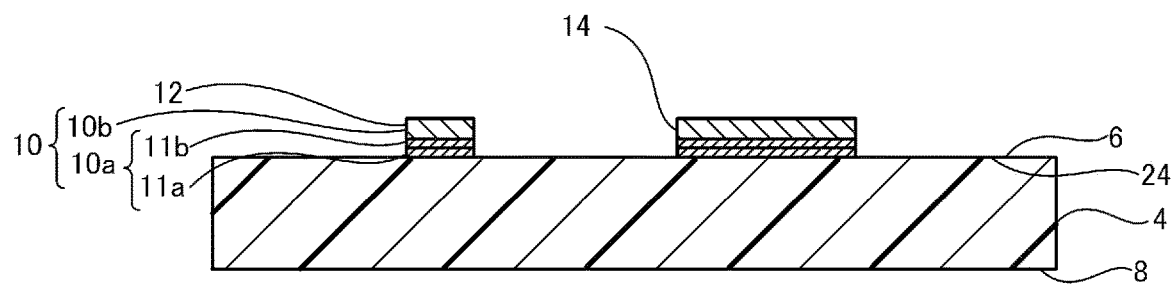
FIG. 2A is a cross-sectional view schematically illustrating a method for manufacturing a printed wiring board according to an embodiment of the present invention.

FIGS. 2A-2I illustrate a method for manufacturing the printed wiring board 2 of the embodiment. FIGS. 2A-2I are cross-sectional views. FIG. 2A illustrates the insulating layer 4 and the first conductor layer 10 formed on the third surface 6 of the insulating layer 4. The first conductor layer 10 is formed using a semi-additive method.

Figure 2B:
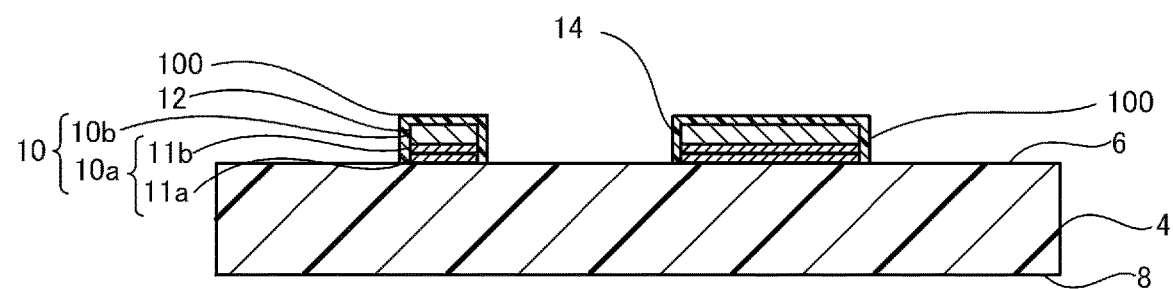
FIG. 2B is a cross-sectional view schematically illustrating a method for manufacturing a printed wiring board according to an embodiment of the present invention.

As illustrated in FIG. 2B, the adhesive layer 100 is formed on the surface of the first conductor layer 10. The surface of the first conductor layer 10 is adjusted to have an arithmetic mean roughness (Ra) in a range of 0.02 μm or more and 0.5 μm or less at the same time as when the seed layer (30a) is removed using an etching solution. The first conductor layer 10 having the rough surface reduces transmission loss. The adhesive layer 100 is formed by immersing the insulating layer 4 and the first conductor layer 10 in a chemical solution containing a nitrogen-based organic compound. In a modified embodiment, the adhesive layer 100 is formed by applying the above chemical solution on the first conductor layer 10.

Figure 2C:
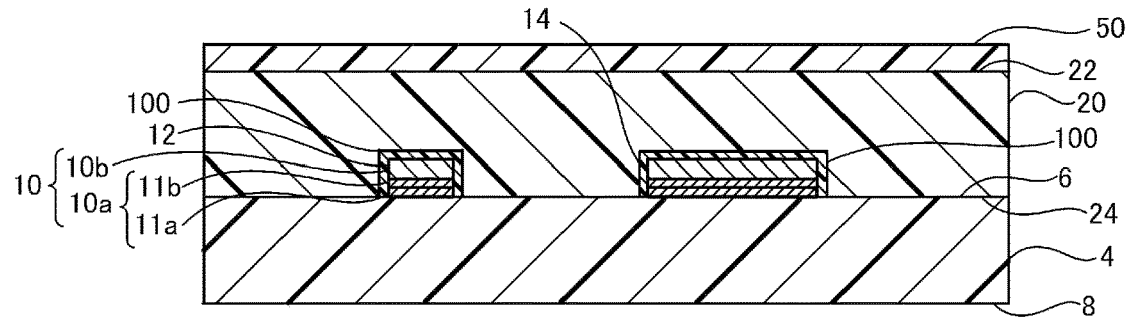
FIG. 2C is a cross-sectional view schematically illustrating a method for manufacturing a printed wiring board according to an embodiment of the present invention.

As illustrated in FIG. 2C, the resin insulating layer 20 and a protective film 50 are formed on the first conductor layer 10 covered by the adhesive layer 100. The second surface 24 of the resin insulating layer 20 faces the third surface 6 of the insulating layer 4. The protective film 50 is formed on the first surface 22 of the resin insulating layer 20.

The protective film 50 completely covers the first surface 22 of the resin insulating layer 20. An example of the protective film 50 is a film formed of polyethylene terephthalate (PET). A release layer (not shown in the drawings) formed of a release agent is formed between the protective film 50 and the resin insulating layer 20.

Figure 2D:
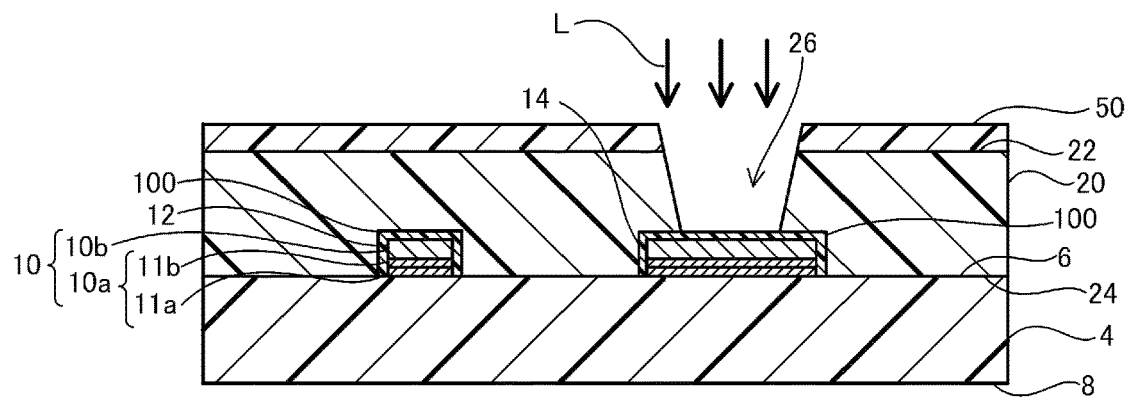
FIG. 2D is a cross-sectional view schematically illustrating a method for manufacturing a printed wiring board according to an embodiment of the present invention.

As illustrated in FIG. 2D, laser (L) is irradiated from above the protective film 50. The laser (L) penetrates the protective film 50 and the resin insulating layer 20 at the same time. The opening 26 for a via conductor reaching the adhesive layer 100 covering the pad 14 is formed. The laser (L) is, for example, UV laser, or $CO_2$ laser. The adhesive layer 100 is not completely removed by the laser (L). The adhesive layer 100 covering the pad 14 is exposed by the opening 26. When the opening 26 is formed, the first surface 22 is covered by the protective film 50. Therefore, when the opening 26 is formed, even when the resin scatters, adherence of the resin to the first surface 22 is suppressed.

Figure 2E:
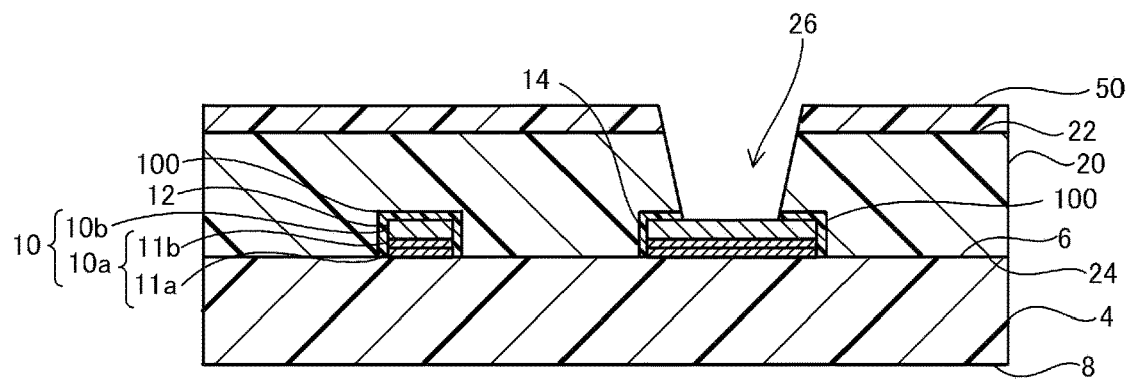
FIG. 2E is a cross-sectional view schematically illustrating a method for manufacturing a printed wiring board according to an embodiment of the present invention.

As illustrated in FIG. 2E, the inside of the opening 26 is cleaned. The adhesive layer 100 exposed from the opening 26 is removed by cleaning the inside of the opening 26. The pad 14 is exposed from the opening 26. Resin residues generated when the opening 26 is formed are removed. The cleaning of the inside of the opening 26 is performed using plasma. That is, the cleaning is performed in a dry process. A gas used in the dry process is a mixed gas of a halogen-based gas (such as a fluorine-based gas or a chlorine-based gas) and an $O_2$ gas, or is a halogen-based gas (such as a fluorine-based gas or a chlorine-based gas) or an $O_2$ gas alone. The cleaning includes a desmear treatment. The adhesive layer 100 formed between the second surface 24 of the resin insulating layer 20 and the pad 14 is not removed. Therefore, no gap is formed between the second surface 24 of the resin insulating layer 20 and the pad 14. By selectively removing the epoxy resin by plasma, the inner wall surface of the opening 26 is roughened by the plasma. The inner wall surface of the opening 26 is formed of the resin and the inorganic particles that form the resin insulating layer 20. On the other hand, the first surface 22 of the resin insulating layer 20 is covered by the protective film 50. The first surface 22 is not affected by the plasma. No unevenness is formed on the first surface 22 of the resin insulating layer 20. The first surface 22 is not roughened. The first surface 22 is formed smooth.

Figure 2F:
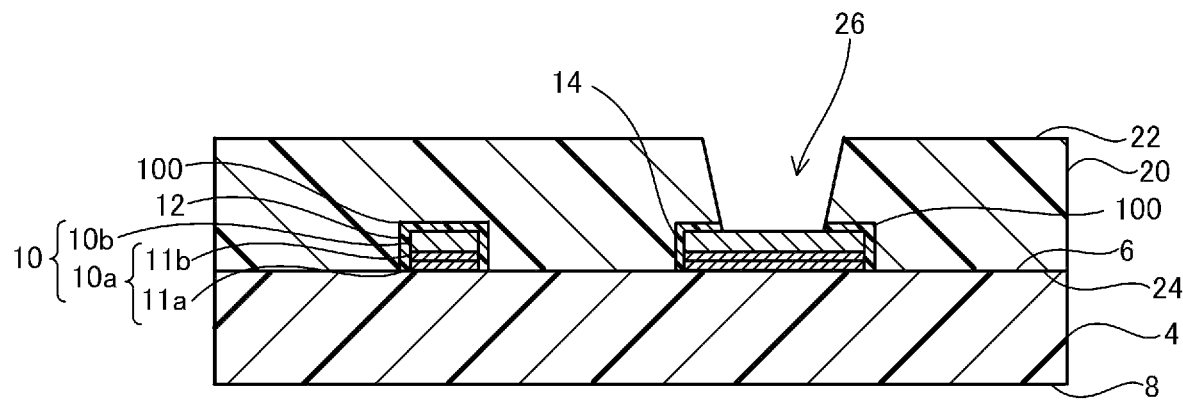
FIG. 2F is a cross-sectional view schematically illustrating a method for manufacturing a printed wiring board according to an embodiment of the present invention.

As illustrated in FIG. 2F, the protective film 50 is removed from the resin insulating layer 20. After the protective film 50 is removed, the first surface 22 of the resin insulating layer 20 is not roughened.

Figure 2G:
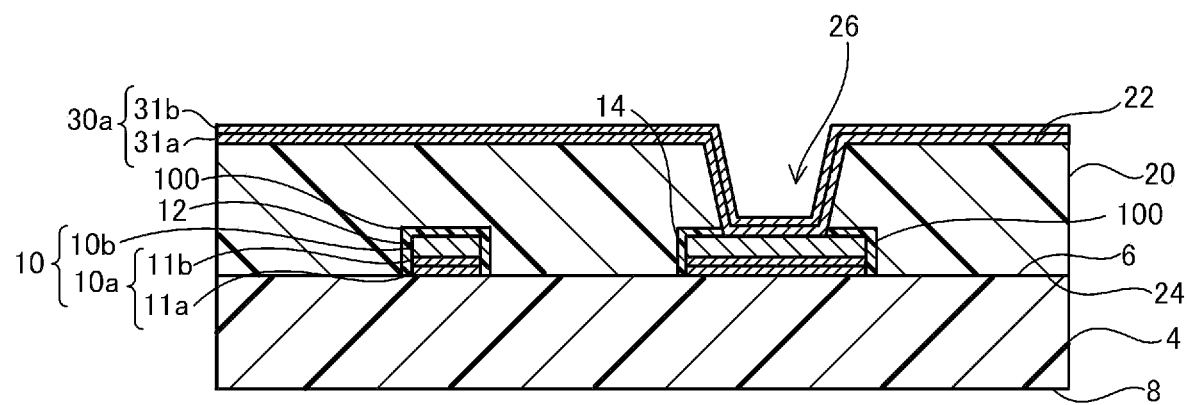
FIG. 2G is a cross-sectional view schematically illustrating a method for manufacturing a printed wiring board according to an embodiment of the present invention.

As illustrated in FIG. 2G, the seed layer (30a) is formed on the first surface 22 of the resin insulating layer 20. The seed layer (30a) is formed by sputtering. The formation of the seed layer (30a) is performed in a dry process. The first layer (31a) is formed on the first surface 22. At the same time, the first layer (31a) is formed on the inner wall surface and the pad 14, which are exposed from the opening 26. After that, the second layer (31b) is formed on the first layer (31a). In the seed layer, the second layer (31b) is formed on the first layer (31a) by sputtering using a material different from that of the first layer (31a). The first layer (31a) and the second layer (31b) are formed of a combination of copper alloys of different materials, or a combination of a copper alloy and copper. The first layer (31a) is formed of a copper alloy. A combination of a copper alloy and the resin insulating layer 20 has a higher adhesion than a combination of copper and the resin insulating layer 20. The second layer (31b) is formed of a copper alloy or copper. The copper alloys of the first layer (31a) and the second layer (31b) have a copper content of 90% or more of a total weight. Since the higher the copper content is, the lower the electrical resistance can be reduced, connection reliability is improved. The seed layer (30a) is also formed on the upper surface of the pad 14 exposed from the opening 26 and on the inner wall surface of the opening 26. The first layer (31a) is formed of a copper alloy containing copper, silicon and aluminum. The second layer (31b) is formed of copper.

Figure 2H:
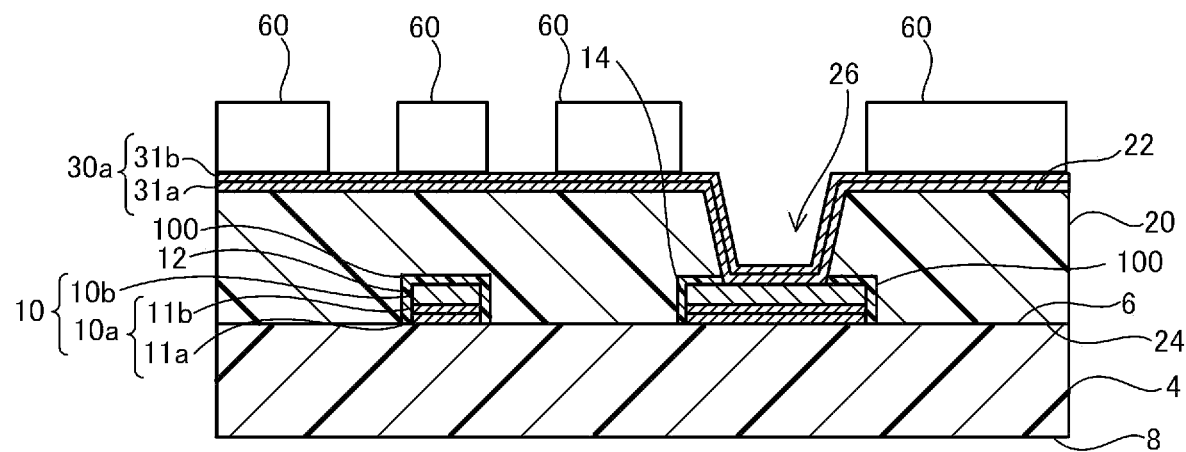
FIG. 2H is a cross-sectional view schematically illustrating a method for manufacturing a printed wiring board according to an embodiment of the present invention.

As illustrated in FIG. 2H, a plating resist 60 is formed on the seed layer (30a). Since the first surface 22 of the resin insulating layer 20 is not roughened, the seed layer (30a) is formed to have a uniform thickness on a low roughness surface. Since the plating resist 60 tightly adheres to the seed layer (30a) without a gap, peeling of the plating resist 60 is prevented and a short circuit between wirings is suppressed by electrolytic plating formation. The plating resist 60 has openings for forming the first signal wiring 32, the second signal wiring 34, and the land 36 (FIG. 1).

Figure 2I:
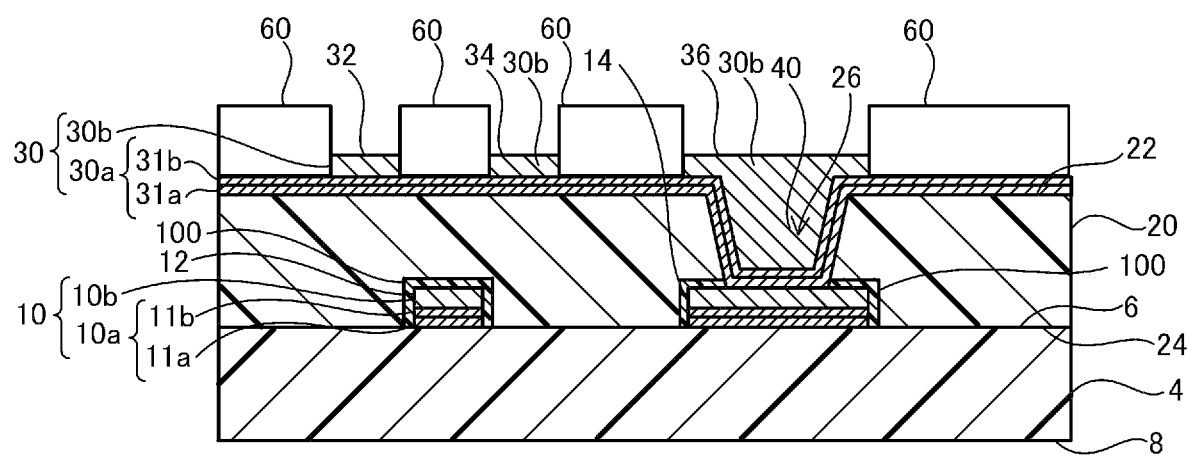
FIG. 2I is a cross-sectional view schematically illustrating a method for manufacturing a printed wiring board according to an embodiment of the present invention.

As illustrated in FIG. 2I, the electrolytic plating film (30b) is formed on the seed layer (30a) exposed from the plating resist 60. The electrolytic plating film (30b) is formed of copper. The electrolytic plating film (30b) fills the opening 26. The first signal wiring 32, the second signal wiring 34, and the land 36 are formed by the seed layer (30a) and the electrolytic plating film (30b) on the first surface 22. The second conductor layer is formed. The via conductor 40 is formed by the seed layer (30a) and the electrolytic plating film (30b) in the opening 26. The via conductor 40 connects the pad 14 and the land 36. The first signal wiring 32 and the second signal wiring 34 form a pair wiring.

After that, the plating resist 60 is removed. The seed layer (30a) exposed from the electrolytic plating film (30b) is removed. Surfaces of the second conductor layer 30 and the via conductor 40 are adjusted to have an arithmetic mean roughness (Ra) of 0.02 μm or more and 0.5 μm or less at the same time as when the seed layer (30a) is removed using an etching solution. The first conductor layer 10 having the rough surface reduces transmission loss. The second conductor layer 30 and the via conductor 40 are formed at the same time. The printed wiring board 2 (FIG. 1) of the embodiment is obtained.

According to the manufacturing method of the embodiment, the adhesive layer 100 formed of a nitrogen-based organic compound is formed between the first conductor layer and the resin insulating layer 20. The first conductor layer 10 and the resin insulating layer 20 adhere to each other by the adhesive layer 100. Adhesion between the first conductor layer 10 and the resin insulating layer 20 is improved. A high quality printed wiring board 2 is provided.

According to the manufacturing method of the embodiment, the first surface 22 of the resin insulating layer 20 is covered with the protective film 50 when the opening 26 is formed in the resin insulating layer 20. When the inside of the opening 26 is cleaned with plasma, the first surface 22 of the resin insulating layer 20 is covered by the protective film 50 (see FIG. 2E). The first surface 22 is protected by the protective film 50 while the cleaning with plasma is performed. Therefore, formation of unevenness on the first surface 22 is prevented. An increase in standard deviation of the relative permittivity in a portion near the first surface 22 of the resin insulating layer 20 is suppressed. The relative permittivity of the first surface 22 does not greatly vary depending on a location. Even when the second conductor layer 30 has the first signal wire 32 and the second signal wire 34, a difference in propagation speed of an electrical signal between the first signal wiring 32 and the second signal wiring 34 is reduced. A noise is suppressed in the printed wiring board 2 formed using the manufacturing method of the embodiment. Even when a logic IC is mounted on the printed wiring board 2 of the embodiment, data transmitted via the first signal wiring 32 and data transmitted via the second signal wiring 34 arrive at the logic IC substantially without delay. Malfunction of the logic IC is suppressed. Even when a length of the first signal wiring 32 and a length of the second signal wiring 34 are mm or more, a difference in propagation speed between the two is reduced. Even when the length of the first signal wiring 32 and the length of the second signal wiring 34 are 10 mm or more and 20 mm or less, malfunction of the logic IC is suppressed. According to the manufacturing method of the embodiment, a high quality printed wiring board 2 is provided.

First Modified Embodiment

In a first modified embodiment of the embodiment, the first layers (11a, 31a) of the seed layers (10a, 30a) are each formed of copper and a second element. The second element is selected from silicon, aluminum, titanium, nickel, chromium, carbon, oxygen, tin, calcium, magnesium, iron, molybdenum, and silver.

Second Modified Embodiment

In a second modified embodiment of the embodiment, the first layers (11a, 31a) of the seed layers (10a, 30a) are each formed of any one metal of aluminum, titanium, nickel, chromium, calcium, magnesium, iron, molybdenum, and silver.

Japanese Patent Application Laid-Open Publication No. 2015-54987 describes a printed wiring board in which a chemical conversion film is formed on a surface of copper forming a circuit using a surface treatment agent containing a tetrazole compound.

It is thought that a printed wiring board in which a circuit and a resin insulating layer are sequentially laminated is formed using the technology of Japanese Patent Application Laid-Open Publication No. 2015-54987. It is thought that the technology of Japanese Patent Application Laid-Open Publication No. 2015-54987 includes forming an opening in the resin insulating layer on the circuit with laser and desmearing inside of the opening with permanganate.

It is thought that, when a desmear treatment is performed with permanganate, the chemical conversion film is excessively removed and a gap is formed between the resin insulating layer and the circuit. It is thought that the circuit and the resin insulating layer do not sufficiently adhere to each other.

A method for manufacturing a printed wiring board according to an embodiment of the present invention includes: forming a first conductor layer having a conductor circuit; forming an adhesive layer of a nitrogen-based organic compound covering a surface of the first conductor layer; forming, after the forming of the adhesive layer, a resin insulating layer, which has a first surface and a second surface on the opposite side with respect to first surface, on the first conductor layer such that the second surface faces the first conductor layer; forming a protective film on the first surface of the resin insulating layer; forming an opening for a via conductor that penetrates the resin insulating layer and reaches the adhesive layer; cleaning inside of the opening with plasma; removing, after the cleaning, the protective film from the resin insulating layer; forming a second conductor layer on the first surface of the resin insulating layer; and forming, in the opening, a via conductor connecting the first conductor layer and the second conductor layer.

In a manufacturing method according to an embodiment of the present invention, the inside of the opening for the via conductor is cleaned with plasma. Formation of a gap between the first conductor layer and the resin insulating layer is suppressed, without excessively removing the adhesive layer. The first conductor layer and the resin insulating layer sufficiently adhere to each other via the adhesive layer. A high quality printed wiring board is provided.

A printed wiring board according to an embodiment of the present invention includes: a first conductor layer; a resin insulating layer that is formed on the first conductor layer, and has a via conductor opening exposing the first conductor layer, a first surface, and a second surface on the opposite side with respect to the first surface; a second conductor layer that is formed on the first surface of the resin insulating layer; and a via conductor that is formed in the opening and connects the first conductor layer and the second conductor layer. An adhesive layer formed of a nitrogen-based organic compound is formed between a surface of the first conductor layer other than a portion exposed from the opening and the resin insulating layer.

In a printed wiring board according to an embodiment of the present invention, the adhesive layer formed of a nitrogen-based organic compound is formed between a surface of the first conductor layer other than a portion exposed from the opening and the resin insulating layer. The first conductor layer and the resin insulating layer sufficiently adhere to each other via the adhesive layer. A high quality printed wiring board is provided.

Obviously, numerous modifications and variations of the present invention are possible in light of the above teachings. It is therefore to be understood that within the scope of the appended claims, the invention may be practiced otherwise than as specifically described herein.

The invention claimed is:

1. A method for manufacturing a printed wiring board, comprising:

forming a first conductor layer including a conductor circuit;

forming, on the first conductor layer, an adhesive layer comprising a nitrogen-based organic compound such that the adhesive layer covers a surface of the first conductor layer;

forming, on the first conductor layer, a resin insulating layer such that the resin insulating layer covers the adhesive layer and has a second surface facing the first conductor layer on an opposite side with respect to a first surface;

forming a protective film on the first surface of the resin insulating layer;

forming an opening for a via conductor in the resin insulating layer such that the opening penetrates through the resin insulating layer and reaches the adhesive layer;

applying plasma to the opening of the resin insulating layer such that the plasma cleans an inside of the opening of the resin insulating layer;

removing the protective film from the resin insulating layer after cleaning the inside of the opening of the resin insulating layer;

forming a second conductor layer on the first surface of the resin insulating layer; and forming a via conductor in the opening of the resin insulating layer such that the via conductor connects the first conductor layer and the second conductor layer, wherein the applying of the plasma includes applying the plasma to the opening of the resin insulating layer such that the plasma removes a portion of the adhesive layer exposed from the opening of the resin insulating layer, and the first conductor layer is formed such that the surface of the first conductor layer has arithmetic mean roughness Ra in a range of 0.02 µm to 0.5 µm.

2. The method for manufacturing a printed wiring board according to claim 1, wherein the forming of the second conductor layer includes forming a seed layer on the first surface of the resin insulating layer by sputtering, forming a plating resist on the seed layer, forming an electrolytic plating film on part of the seed layer exposed from the plating resist, removing the plating resist, and removing part of the seed layer exposed from the electrolytic plating film.

3. The method for manufacturing a printed wiring board according to claim 2, wherein the forming of the seed layer includes forming a first layer by sputtering, and forming a second layer on the first layer by sputtering such that a material of the second layer is different from a material of the first layer.

4. The method for manufacturing a printed wiring board according to claim 3, wherein the material of the first layer and the material of the second layer are a combination of copper alloys of different materials or a combination of a copper alloy and copper.

5. The method for manufacturing a printed wiring board according to claim 4, wherein the copper alloys have a copper content of 90% or more of a total weight.

6. The method for manufacturing a printed wiring board according to claim 3, wherein the material of the first layer is a copper alloy comprising at least one of silicon, aluminum, titanium, nickel, chromium, iron, molybdenum, silver, carbon, oxygen, tin, calcium and magnesium, and the material of the second layer is copper.

7. The method for manufacturing a printed wiring board according to claim 3, wherein the material of the first layer includes at least one of aluminum, titanium, nickel, chromium, calcium, magnesium, iron, molybdenum and silver, and the material of the second layer is copper.

8. The method for manufacturing a printed wiring board according to claim 1, wherein the forming of the opening for the via conductor in the resin insulating layer includes applying laser such that the laser penetrates through the protective film and the resin insulating layer at a same time.

9. The method for manufacturing a printed wiring board according to claim 1, wherein the forming of the resin insulating layer includes no roughening of the first surface of the resin insulating layer.

10. The method for manufacturing a printed wiring board according to claim 2, wherein the forming of the resin insulating layer includes no roughening of the first surface of the resin insulating layer before the forming of the seed layer.

11. The method for manufacturing a printed wiring board according to claim 1, wherein the forming of the second conductor layer includes forming a pair wiring comprising a first signal wiring and a second signal wiring.

12. The method for manufacturing a printed wiring board according to claim 1, wherein the forming of the protective film includes forming a release layer between the first surface and the protective film, and the forming of the opening for the via conductor in the resin insulating layer includes forming the opening for the via conductor in the resin insulating layer such that the opening penetrates through the protective film, the release layer, and the resin insulating layer and reaches the adhesive layer.

13. A printed wiring board, comprising:
a first conductor layer;
a resin insulating layer formed on the first conductor layer;
a second conductor layer formed on a surface of the resin insulating layer;
a via conductor formed in an opening formed in the resin insulating layer such that the via conductor is connecting the first conductor layer and the second conductor layer; and
an adhesive layer comprising a nitrogen-based organic compound and formed between the resin insulating layer and a surface of the first conductor layer other than a portion exposed from the opening,
wherein the first conductor layer is formed such that the surface of the first conductor layer has arithmetic mean roughness Ra in a range of 0.02 µm to 0.5 µm.

14. The printed wiring board according to claim 13, wherein the second conductor layer includes a seed layer formed on the surface of the resin insulating layer such that the seed layer includes a first layer, and a second layer formed on the first layer and comprising a material that is different from a material of the first layer.

15. The printed wiring board according to claim 14, wherein the material of the first layer and the material of the second layer are a combination of copper alloys of different materials or a combination of a copper alloy and copper.

16. The printed wiring board according to claim 15, wherein the copper alloys have a copper content of 90% or more of a total weight.

17. The printed wiring board according to claim 14, wherein the material of the first layer is a copper alloy comprising at least one of silicon, aluminum, titanium, nickel, chromium, iron, molybdenum, silver, carbon, oxygen, tin, calcium and magnesium, and the material of the second layer is copper.

18. The printed wiring board according to claim 13, wherein the resin insulating layer is formed such that the first surface of the resin insulating layer includes no roughening.

19. The printed wiring board according to claim 14, wherein the resin insulating layer is formed such that the first surface of the resin insulating layer includes no roughening.

20. The printed wiring board according to claim 15, wherein the resin insulating layer is formed such that the first surface of the resin insulating layer includes no roughening.

* * * * *